(12) United States Patent
Hwang et al.

(10) Patent No.: US 10,643,906 B2
(45) Date of Patent: May 5, 2020

(54) METHODS OF FORMING A TRANSISTOR AND METHODS OF FORMING AN ARRAY OF MEMORY CELLS

(71) Applicant: Micron Technology, Inc., Boise, ID (US)

(72) Inventors: David K. Hwang, Boise, ID (US); John A. Smythe, Boise, ID (US); Haitao Liu, Boise, ID (US); Richard J. Hill, Boise, ID (US); Deepak Chandra Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 15/843,493

(22) Filed: Dec. 15, 2017

(65) Prior Publication Data

US 2019/0189515 A1 Jun. 20, 2019

(51) Int. Cl.
*H01L 21/8239* (2006.01)
*H01L 21/8234* (2006.01)
(Continued)

(52) U.S. Cl.
CPC .......... *H01L 21/8239* (2013.01); *G11C 11/40* (2013.01); *H01L 21/8229* (2013.01);
(Continued)

(58) Field of Classification Search
CPC ... H01L 21/0257–02579; H01L 21/027; H01L 21/033; H01L 21/0335;
(Continued)

(56) References Cited

U.S. PATENT DOCUMENTS 5,854,111 A * 12/1998 Wen ................ G11C 17/06
438/275
6,013,548 A 1/2000 Burns, Jr. et al.
(Continued)

FOREIGN PATENT DOCUMENTS

TW 375795 12/1999
TW 2004269996 12/2004
(Continued)

OTHER PUBLICATIONS

Ho et al., "Wafer-Scale, Sub-5 nm Junction Formation By Monolayer Doping and Conventional Spike Annealing", Nano Letters vol. 9, No. 2, Oct. 28, 2008, United States, pp. 725-730.
(Continued)

*Primary Examiner* — Maliheh Malek
(74) *Attorney, Agent, or Firm* — Wells St. John P.S.

(57) ABSTRACT

An embodiment of the invention comprises a method of forming a transistor comprising forming a gate construction having an elevationally-outermost surface of conductive gate material that is lower than an elevationally-outer surface of semiconductor material that is aside and above both sides of the gate construction. Tops of the semiconductor material and the conductive gate material are covered with masking material, two pairs of two opposing sidewall surfaces of the semiconductor material are laterally exposed above both of the sides of the gate construction. After the covering, the semiconductor material that is above both of the sides of the gate construction is subjected to monolayer doping through each of the laterally-exposed two opposing sidewall surfaces of each of the two pairs and forming there-from doped source/drain regions above both of the sides of the gate construction.

21 Claims, 10 Drawing Sheets

(51) Int. Cl.
  *H01L 29/10* (2006.01)
  *G11C 11/40* (2006.01)
  *H01L 27/108* (2006.01)
  *H01L 21/8229* (2006.01)

(52) U.S. Cl.
  CPC .............. *H01L 21/823437* (2013.01); *H01L 21/823462* (2013.01); *H01L 27/10885* (2013.01); *H01L 27/10888* (2013.01); *H01L 27/10891* (2013.01); *H01L 29/105* (2013.01); *G11C 2211/4016* (2013.01); *H01L 21/823418* (2013.01)

(58) Field of Classification Search
  CPC ......... H01L 21/8229; H01L 21/823418; H01L 21/823437; H01L 21/823462; H01L 21/8239; H01L 27/10885; H01L 27/10888; H01L 27/10891; H01L 29/105; H01L 29/06
  See application file for complete search history.

(56) References Cited

U.S. PATENT DOCUMENTS

| | | | |
|---|---|---|---|
| 9,583,489 B1* | 2/2017 | Anderson | H01L 27/0921 |
| 9,997,521 B2* | 6/2018 | Kim | H01L 27/10885 |
| 10,170,376 B1* | 1/2019 | Hung | H01L 21/324 |
| 10,304,943 B2* | 5/2019 | Lee | H01L 29/66621 |
| 2004/0235240 A1 | 11/2004 | Hsu et al. | |
| 2005/0167719 A1 | 8/2005 | Chen et al. | |
| 2005/0179075 A1* | 8/2005 | Lee | H01L 21/823412 257/296 |
| 2005/0189582 A1* | 9/2005 | Mikolajick | H01L 27/115 257/324 |
| 2007/0034922 A1* | 2/2007 | Bhattacharyya | G11C 11/005 257/296 |
| 2007/0082448 A1* | 4/2007 | Kim | H01L 27/10876 438/268 |
| 2007/0253233 A1* | 11/2007 | Mueller | G11C 5/063 365/51 |
| 2009/0029520 A1* | 1/2009 | Chang | H01L 21/76224 438/424 |
| 2009/0294842 A1* | 12/2009 | Juengling | H01L 21/3081 257/329 |
| 2010/0066440 A1* | 3/2010 | Juengling | H01L 29/66795 327/537 |
| 2011/0217820 A1* | 9/2011 | Cho | H01L 21/768 438/270 |
| 2011/0298046 A1* | 12/2011 | Hong | H01L 27/10885 257/331 |
| 2012/0018702 A1* | 1/2012 | Javey | H01L 21/2233 257/14 |
| 2012/0052640 A1 | 3/2012 | Fischer et al. | |
| 2012/0126883 A1* | 5/2012 | Juengling | H01L 21/823431 327/581 |
| 2012/0214285 A1 | 8/2012 | Guha et al. | |
| 2012/0217570 A1* | 8/2012 | Kim | H01L 27/10876 257/324 |
| 2013/0049072 A1* | 2/2013 | Heineck | H01L 27/10876 257/202 |
| 2013/0187207 A1* | 7/2013 | Tang | H01L 29/66795 257/288 |
| 2013/0221436 A1 | 8/2013 | Hossain et al. | |
| 2013/0234230 A1* | 9/2013 | Takesako | H01L 21/2257 257/324 |
| 2013/0299895 A1* | 11/2013 | Oxland | H01L 21/02538 257/329 |
| 2013/0316513 A1* | 11/2013 | Basker | H01L 21/845 438/400 |
| 2014/0252475 A1* | 9/2014 | Xu | H01L 21/02694 257/347 |
| 2015/0028406 A1* | 1/2015 | Tang | H01L 29/66621 257/296 |
| 2015/0243748 A1* | 8/2015 | Pulugurtha | H01L 29/7827 257/330 |
| 2016/0002784 A1 | 1/2016 | Omstead | |
| 2016/0093732 A1* | 3/2016 | Lee | H01L 29/7827 257/329 |
| 2016/0365411 A1* | 12/2016 | Yeh | H01L 29/0673 |
| 2017/0040449 A1* | 2/2017 | Asenov | H01L 29/41775 |
| 2017/0062575 A1* | 3/2017 | Song | H01L 29/408 |
| 2017/0162694 A1* | 6/2017 | Basker | H01L 29/7848 |
| 2017/0179031 A1* | 6/2017 | Pandey | H01L 23/535 |
| 2017/0186844 A1 | 6/2017 | Kim et al. | |
| 2018/0025911 A1* | 1/2018 | Walke | H01L 21/02387 257/773 |
| 2018/0212055 A1* | 7/2018 | Chen | H01L 29/4236 |
| 2018/0247939 A1* | 8/2018 | Glass | H01L 29/785 |
| 2018/0315833 A1* | 11/2018 | Duriez | H01L 29/66553 |
| 2019/0096767 A1* | 3/2019 | Yeh | H01L 21/02181 |
| 2019/0115351 A1* | 4/2019 | Jeon | H01L 27/1052 |
| 2019/0140050 A1* | 5/2019 | Smith | H01L 21/76229 |
| 2019/0165009 A1* | 5/2019 | Wu | H01L 27/14607 |
| 2019/0165175 A1* | 5/2019 | More | H01L 29/66803 |
| 2019/0244933 A1* | 8/2019 | Or-Bach | H01L 25/167 |
| 2019/0287975 A1* | 9/2019 | Kim | H01L 27/10823 |
| 2020/0013791 A1* | 1/2020 | Or-Bach | H01L 29/42332 |

FOREIGN PATENT DOCUMENTS

TW 107137864 7/2019
WO PCT/US2018/055407 4/2019

OTHER PUBLICATIONS

Ho et al., "Controlled Nanoscale Doping of Semiconductors via Molecular Monolayers", Nature Materials vol. 7, Nov. 11, 2007, United Kingdom, pp. 62-67.
Lee et al., "High Performance Poly Si Junctionless Transistors with Sub-5nm Conformally Doped Layers By Monolayer Doping and Microwave Incorporating CO2 Laser Annealing for 3d Stacked ICs Applications", IEEE, 2015, United States, pp. 6.2.1-6.2.4.
Ye et al., "Doping Of Semiconductors By Molecular Monolayers: Monolayer Formation, Dopant Diffusion And Application", Materials Science In Semiconductor Processing 62, 2017, United Kingdom, pp. 128-134.

\* cited by examiner

METHODS OF FORMING A TRANSISTOR AND METHODS OF FORMING AN ARRAY OF MEMORY CELLS

TECHNICAL FIELD

Embodiments disclosed herein pertain to methods of forming a transistor and to methods of forming an array of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Transistors may be used in circuitry other than memory circuitry.

DETAILED DESCRIPTION OF EXAMPLE EMBODIMENTS

Embodiments of the invention encompass methods of forming a transistor and methods of forming an array of memory cells that individually comprise a transistor and a capacitor (i.e., at least one transistor and at least one capacitor).

Figure 1:
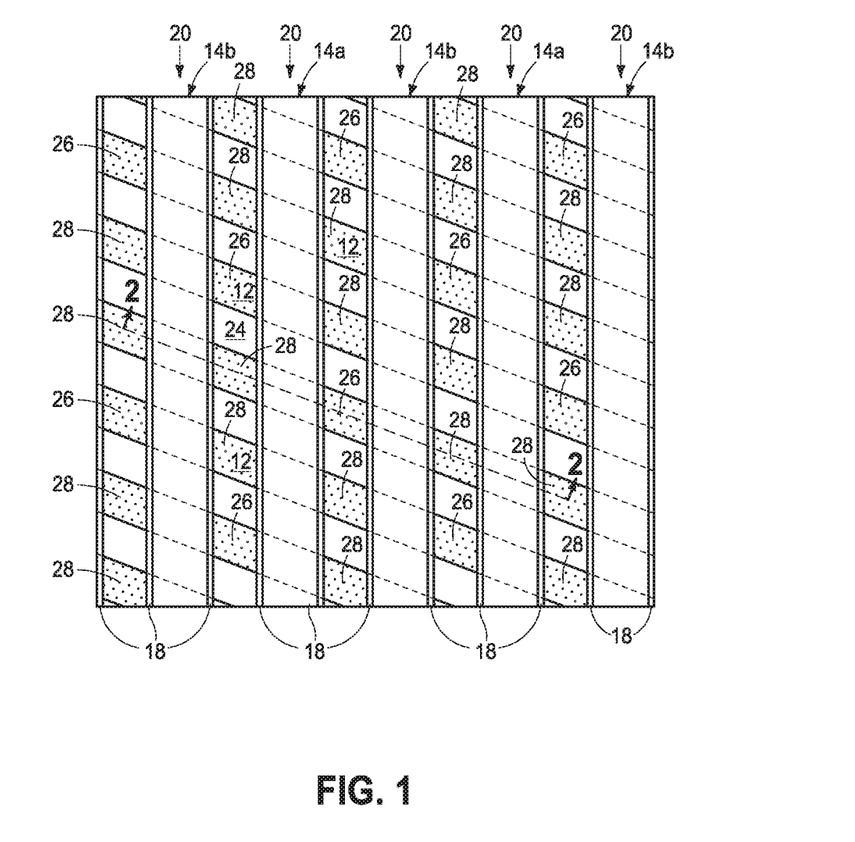
FIG. 1 is a diagrammatic cross-sectional view of a portion of an array of memory cells in process in accordance with an embodiment of the invention, and is taken through line 1-1 in FIG. 2.
Figure 2:
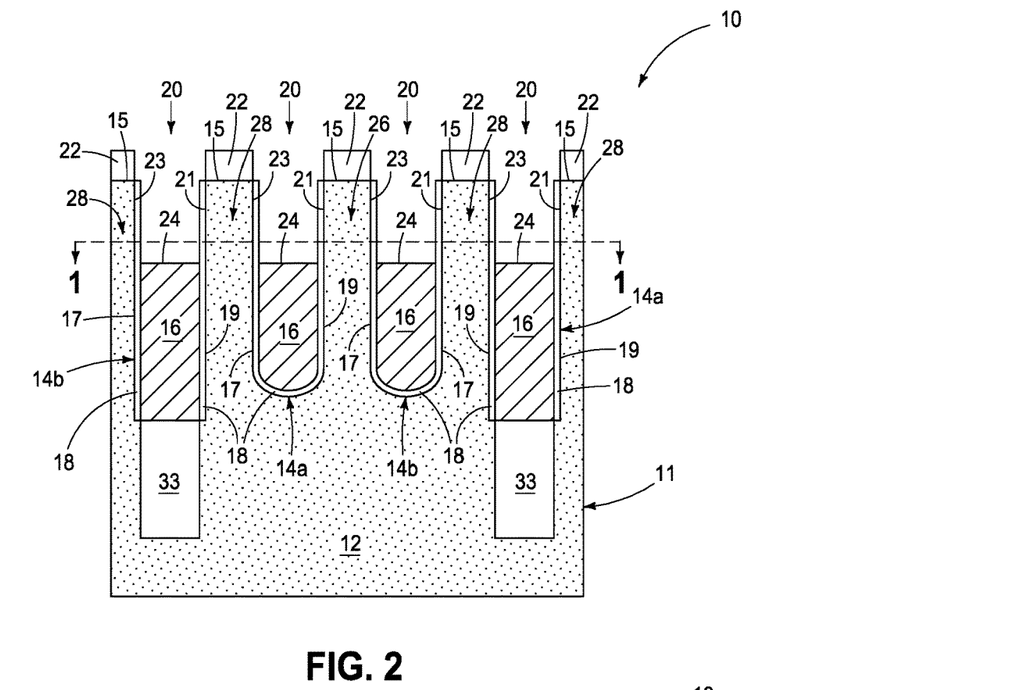
FIG. 2 is a cross-sectional view taken through line 2-2 in FIG. 1.

Referring to FIGS. 1 and 2, an example construction 10 comprises a base substrate 11 that may include one or more of conductive/conductor/conducting (i.e., electrically herein), semiconductive/semiconductor semiconducting, or insulative/insulator/insulating (i.e., electrically herein) materials. Various materials have been formed above base substrate 11. Materials may be aside, elevationally inward of, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array of memory cells may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Example base substrate 11 comprises suitably doped semiconductor material 12 (e.g., monocrystalline silicon) that in part functions as a channel of transistors.

Masking material 22 (e.g., thin silicon dioxide atop semiconductor material 12 and thicker silicon nitride atop the silicon dioxide) has been formed directly on semiconductor material 12. Such is shown as having been patterned (e.g.

using photolithography) and subsequently used as a mask in forming trenches 20 into semiconductor material 12. Pitch multiplication may be used. The FIG. 2 cross-section shows trenches 20 passing over trench isolation 33 (e.g., one or both of silicon nitride and silicon dioxide) of the two laterally-outermost trenches 20. An example depth of trenches 20 from the depicted tops 15 of semiconductor material 12 to the bases of trench isolation 33 is 2,000 to 3,000 Angstroms.

Recessed-access-gate-line constructions 14a, 14b have been formed within semiconductor material 12, for example within trenches 20 as shown. Example individual constructions 14a, 14b comprise conductive gate material 16 having an elevationally-outermost surface 24. Example materials 16 include elemental metals (e.g., tungsten, titanium, copper, etc.), metal material (e.g., metal nitrides, metal silicide's, metal carbides, etc.), and conductively-doped-semiconductive materials (e.g., silicon, gallium, etc.), including mixtures thereof. Gate insulator material 18 (e.g., silicon dioxide and/or high k dielectrics) is aside conductive gate material 16. Example thickness for conductive gate material 16 where directly above semiconductor material 12 (e.g., the two laterally-middle constructions 14a and 14b in FIG. 3) is 800 to 1,200 Angstroms. Example thickness for gate insulator 18 is 50 to 90 Angstroms. Recessed-access-gate-line constructions 14a, 14b may be considered as individually comprising sides 17 and 19, for example in the depicted FIG. 2 cross-section. Elevationally-outermost surface 24 of conductive gate material 16 is lower than elevationally-outermost surface 15 of semiconductor material 12 that is aside and above both sides 17 and 19 of an individual recessed-access-gate-line construction 14a, 14b.

Recessed-access-gate-line constructions 14a, 14b may be considered as comprising individual pairs 14a/14b that are laterally-spaced relative one another (e.g., in vertical cross-sections along and parallel to line 2-2 in FIG. 1). Pairs 14a/14b individually comprise a digit-line-contact region 26 laterally-inward between constructions 14a and 14b of the pair and a capacitor-contact region 28 laterally-outward of each of constructions 14a and 14b of the pair. Semiconductor material 12 that is above both sides 17 and 19 of individual recessed-access-gate line constructions 14a, 14b may be considered as individually comprising two opposing sidewall surfaces 21 and 23. One set of sidewalls surfaces 21 and 23 may be considered as a pair 21/23, with thereby there being two pairs 21/23 of two opposing sidewall surfaces 21 and 23 above both sides 17 and 19 of individual recessed-access-gate line constructions 14. Regardless, in one embodiment and as shown, gate insulator material 18 also extends elevationally along sidewall surfaces 21 and 23. Example length of individual sidewall surfaces 21 and 23 above materials 18 and 30 is 400 to 800 Angstroms.

Figure 3:
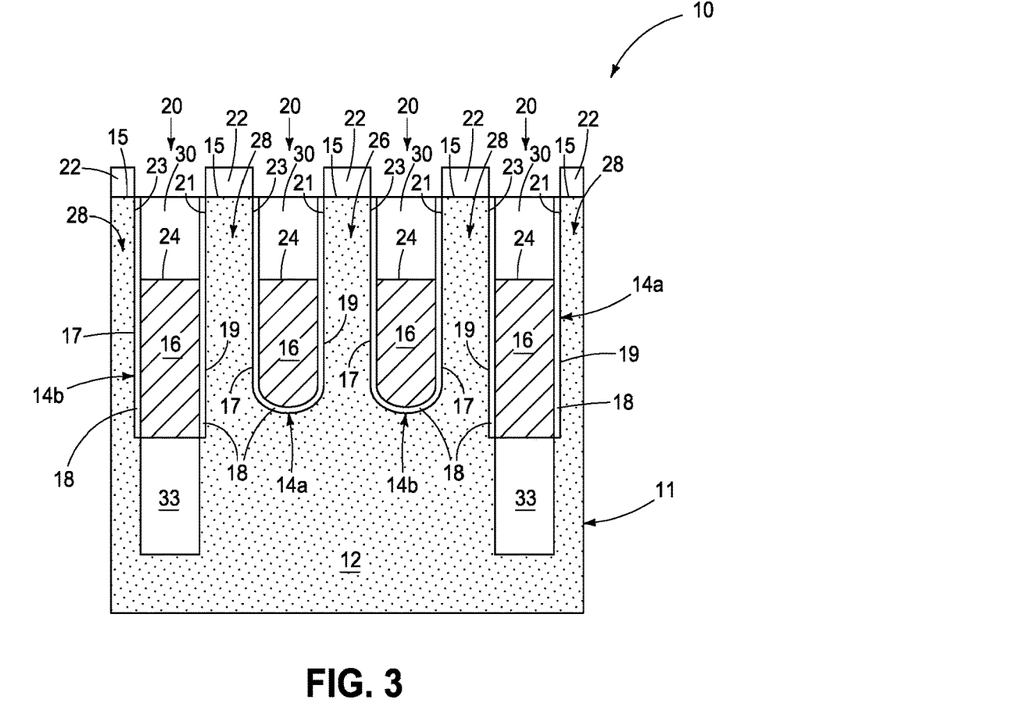
FIG. 3 is a view of the FIG. 2 construction at a processing step subsequent to that shown by FIG. 2.

Referring to FIG. 3, masking material 30 (e.g., silicon dioxide) has been formed within trenches 20 atop conductive gate material 16. In one embodiment and as shown, masking material 30 has been formed laterally over two facing sidewall surfaces 23, 21 of semiconductor material 12 that is above both sides 17 and 19 of gate construction 14. Such two facing sidewall surfaces 23 and 21 individually are a different one of two opposing sidewall surfaces from a different one of two pairs 21/23. For example, and as shown, such an individual sidewall 23 is one from one pair 21/23 (e.g., the left-depicted pair) and an individual other sidewall 21 is one from another pair 21/23 (e.g., the right-depicted pair). In one embodiment and as shown, masking material 30 is formed laterally aside gate insulator material 18 that extends elevationally along such two facing sidewalls surfaces 23 and 21.

Figure 4:
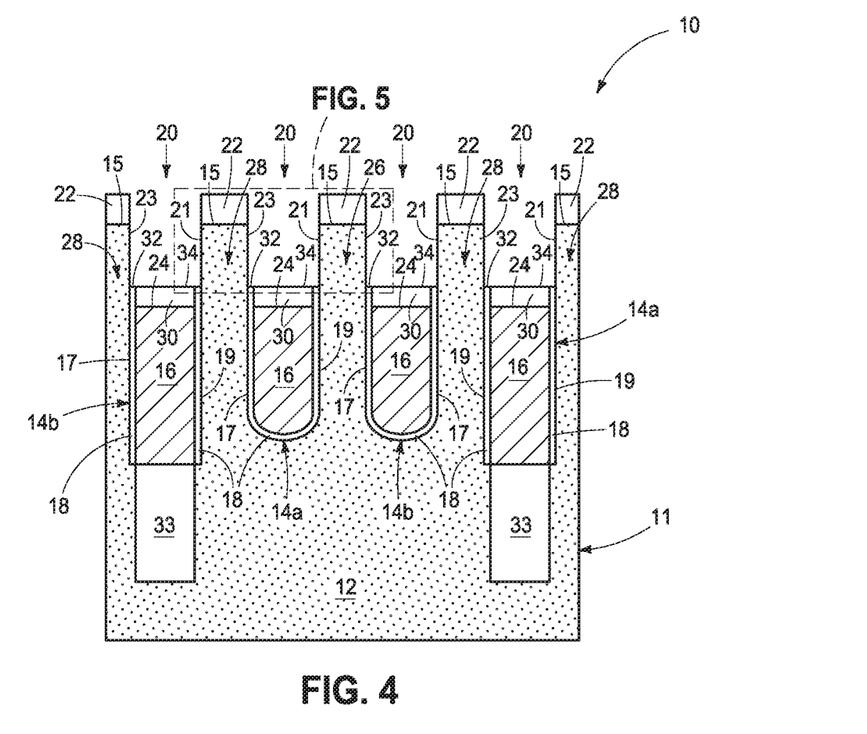
FIG. 4 is a view of the FIG. 3 construction at a processing step subsequent to that shown by FIG. 3.

Referring to FIG. 4, masking material 30 has been elevationally recessed to leave top 24 of conductive gate material 16 covered by masking material 30. Further, in one embodiment and as shown, gate insulator 18 has been elevationally recessed. An example technique for such elevationally recessing is chemical etching using one or more etching chemistries depending upon the composition(s) of materials 30 and 18. In one embodiment, materials 30 and 18 are of the same composition relative one another and the elevationally recessing of such materials occurs by chemical etching such materials at the same time. In one embodiment, masking material 22 atop semiconductor material 12 and masking material 30 atop conductive gate material 16 are formed to comprise different compositions relative one another (e.g., at least an outer portion of masking material 22 being silicon nitride and materials 18 and 30 being silicon dioxide). In one such embodiment and as shown, the chemical etching has been conducted selectively relative to masking material 22 that is atop semiconductor material 12. Regardless, in one embodiment, gate insulator material 18 and masking material 30 after the act of elevationally recessing such materials have elevationally-outermost surfaces 32 and 34, respectively, that are at a common elevation relative one another above conductive gate material 16. Example thickness of materials 18 and 30 above conductive gate material 16 is 30 to 100 Angstroms. One or both of materials 18 and 30 above conductive gate material 16 may at some point be sacrificial.

The above example processings are example techniques whereby tops 15 of semiconductor material 12 and top 24 of individual regions of conductive gate material 16 have been covered with masking material 22, 30. Two pairs 21/23 of two opposing sidewall surfaces 21 and 23 of semiconductor material 12 in FIG. 4 are laterally exposed above both sides 17 and 19 of individual recessed-access-gate-line constructions 14a, 14b. In one embodiment and as described above, such act of covering tops 15 and top 24 occurs over different time-spaced periods of time, and in one embodiment as shown and described wherein tops 15 of semiconductor material 12 have been covered with masking material 22 before the covering of tops 24 of conductive gate material 16 with masking material 30. Regardless, in one embodiment and as described above, the act of covering forms masking material 22 atop semiconductor material 12 and masking material 30 atop conductive gate material 16 to comprise different compositions relative one another.

Figure 5:
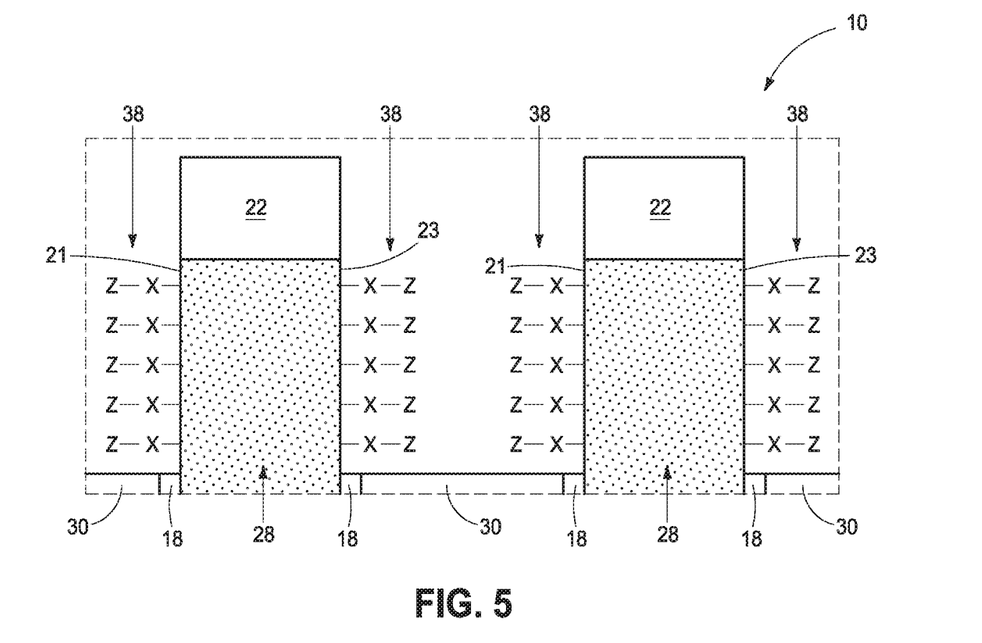
FIG. 5 is an enlarged view of a portion of the FIG. 4 construction at a processing step subsequent to that shown by FIG. 4.

FIG. 5 is a diagrammatic enlarged portion of FIG. 4 and shows processing occurring subsequently to that described above for FIG. 4. Specifically, a dopant monolayer 38 has been formed directly on each of laterally-exposed two opposing sidewall surfaces 21 and 23 of each of two pairs 21/23 above both sides 17 and 19 of individual recessed-access-gate-line constructions 14a, 14b. In one embodiment, dopant monolayers 38 and the method comprises monolayer doping whereby by definition dopant monolayers 38 are individually formed as a self-assembled covalently-bonded dopant-containing monolayer and directly on each of laterally exposed two opposing sidewall surfaces 21 and 23 of each of two pairs 21/23, for example as shown. Specifically, example dopant monolayers 38 are individually diagrammatically shown as comprising individual molecules comprising a species Z and a species X bonded relative one another, with species X being covalently bonded to surface 21 or 23. For example, and by way of examples only, surfaces 21 and 23 may be exposed to dilute HF at room temperature to remove any native oxide and leave a positively-charged surface. Surfaces 21 and 23 may then be exposed to an organic dopant-containing source/precursor and mesitylene as a solvent (from 4:1 to 25:1 by volume solvent to source/precursor) for 2.5 hours at 120° C. to form individual monolayers 38. Diethyl 1-propylphosphonate is an example P dopant source, allylboronic acid pinacol ester is an example B dopant source, and triallylarsine is an example As dopant source.

Alternately and by way of example only, individual dopant monolayers 38 may be formed by atomic layer deposition to include some conductivity-modifying dopant formed as a monolayer analogous to or the same as monolayer 38 or formed as a plurality (i.e., at least two) of stacked monolayers (not shown).

Figure 6:
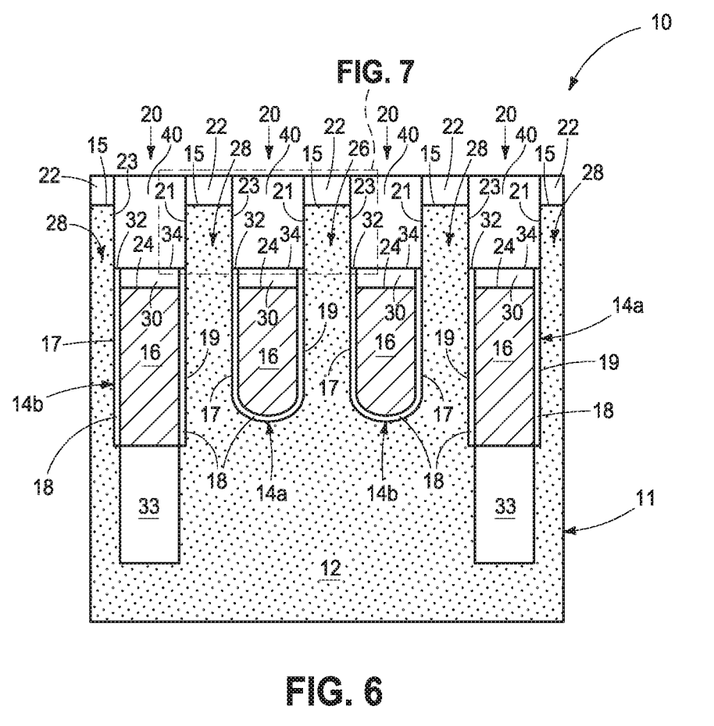
FIG. 6 is a view of the FIG. 4 construction at a processing step subsequent to that shown by FIG. 5.
Figure 7:
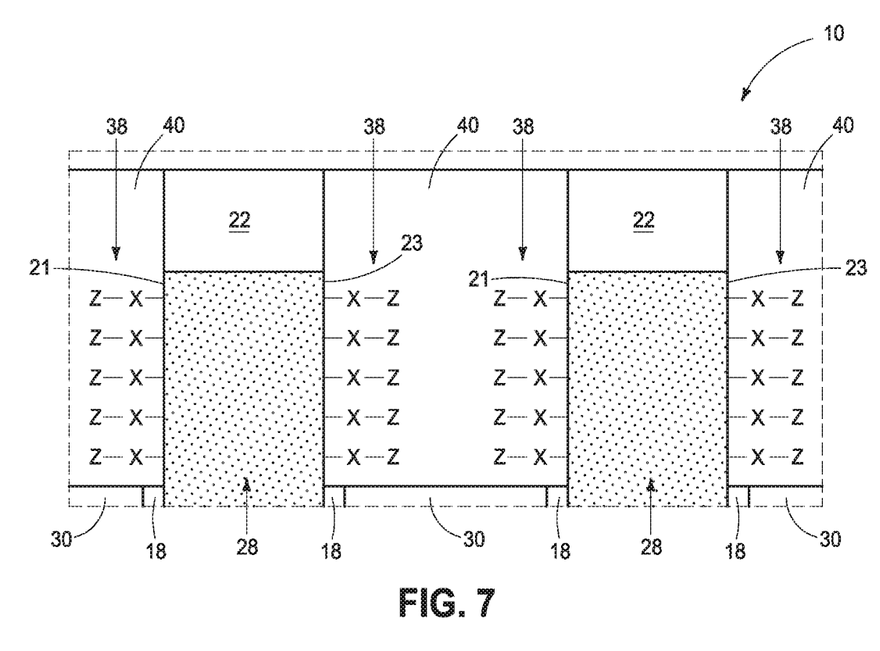
FIG. 7 is an enlarged view of a portion of the FIG. 6 construction.
Figure 8:
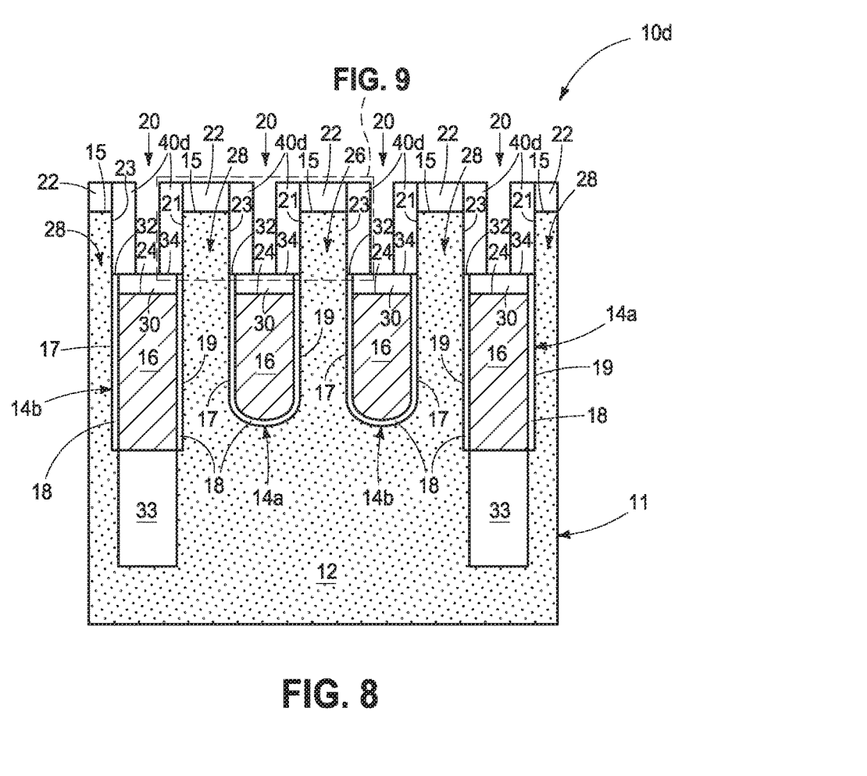
FIG. 8 is a view of the FIG. 4 construction at an alternate processing step subsequent to that shown by FIG. 5.
Figure 9:
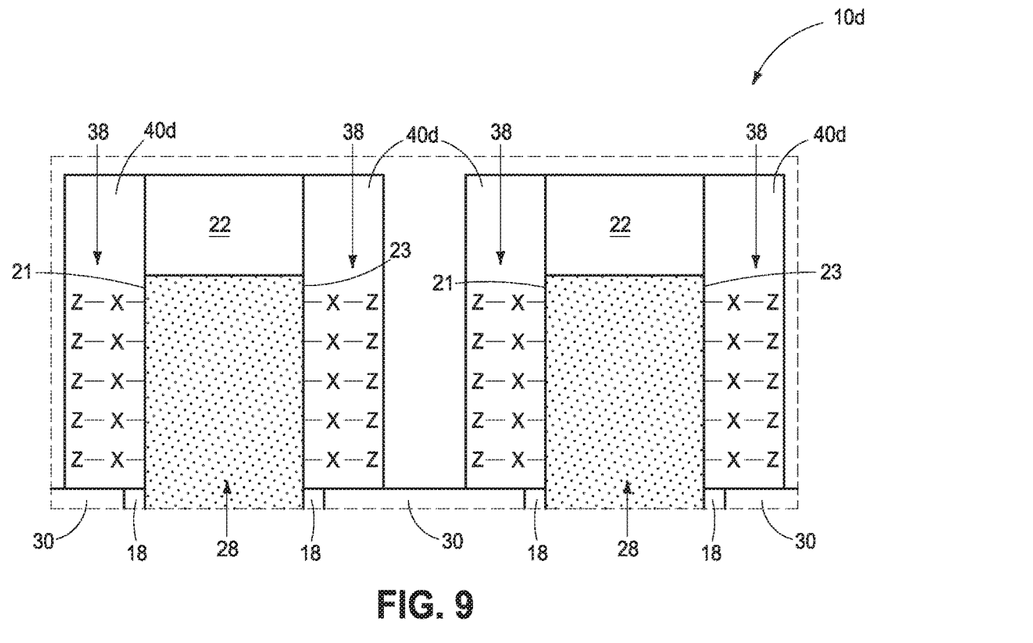
FIG. 9 is an enlarged view of a portion of the FIG. 8 construction.

Referring to FIGS. 6 and 7, and in one embodiment, a covering material 40, in one embodiment which is dielectric (e.g., $SiO_2$), has been formed directly on dopant monolayers 38. FIGS. 6 and 7 show an example embodiment wherein covering material 40 completely fills space between immediately-adjacent projections of semiconductor material 12. Alternately, the covering material may be formed to less-than-fill such spaces, for example as is shown as covering material 40d with respect to an alternate construction 10d in FIGS. 8 and 9. Like numerals from the above-described embodiments have been used where appropriate, with some construction differences being indicated with the suffix "d". Any other attribute(s) or aspect(s) as shown and/or described herein with respect to other embodiments may be used.

Figure 10:
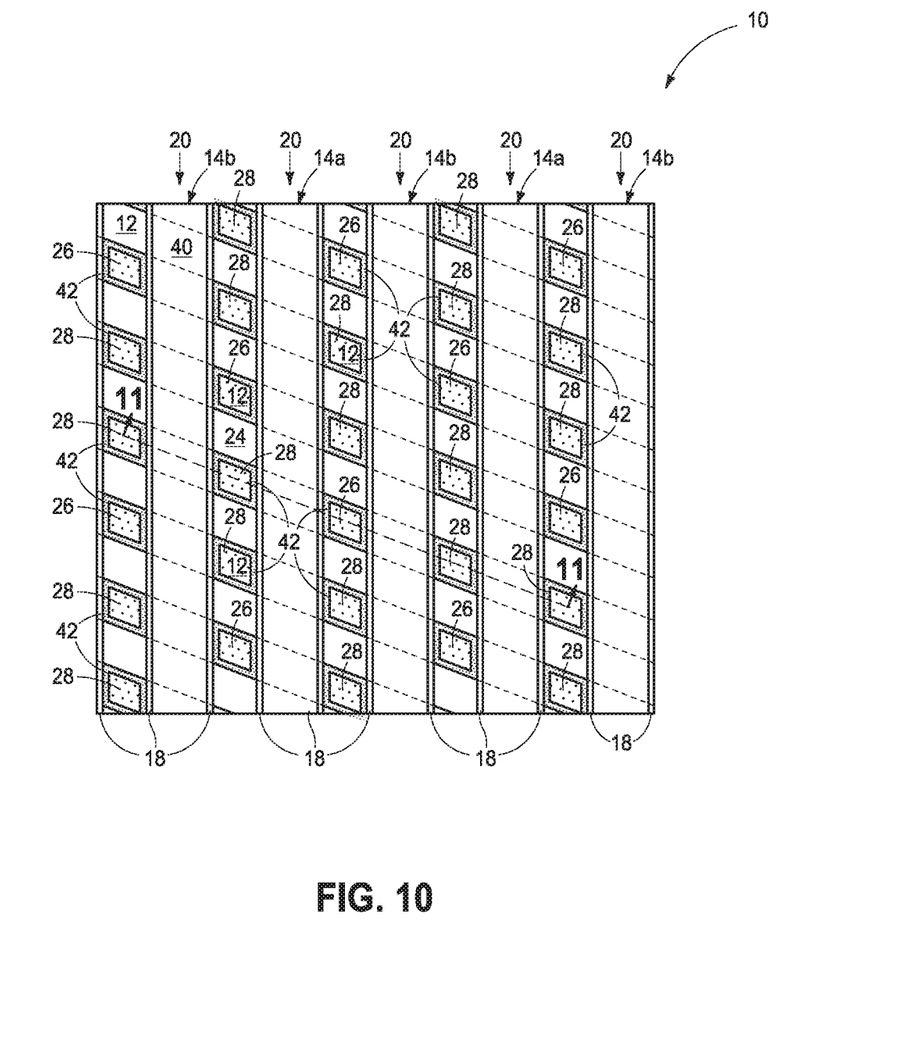
FIG. 10 is a view of the FIG. 1 construction at a processing step subsequent to that shown by FIGS. 6 and 7, and is taken through line 10-10 in FIG. 11.
Figure 11:
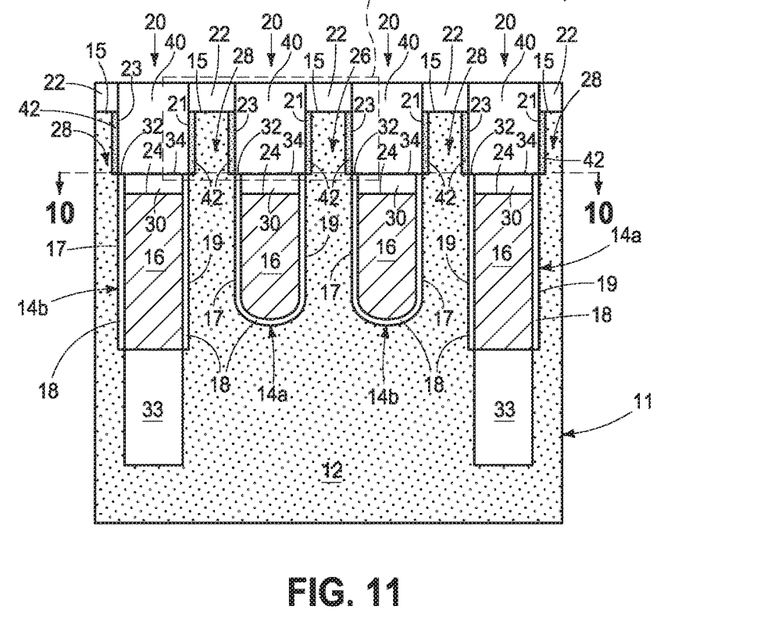
FIG. 11 is a cross-sectional view taken through line 11-11 in FIG. 10.
Figure 12:
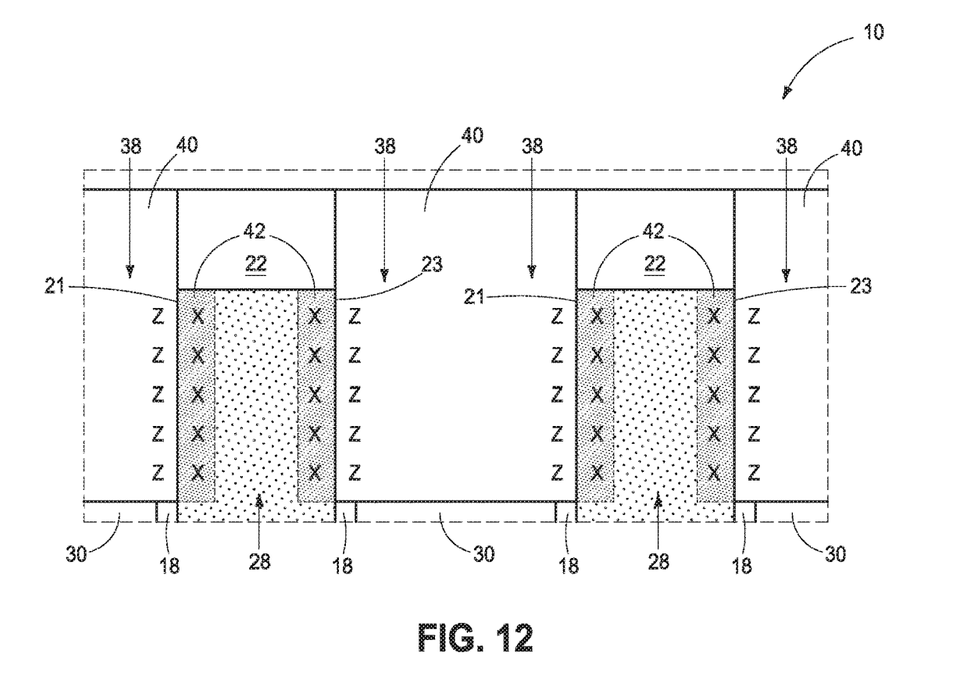
FIG. 12 is an enlarged view of a portion of the FIG. 11 construction.

Referring to FIGS. 10-12, dopants (e.g., indicated by species X, and which may be only a portion of species X) have been diffused (e.g., by rapid thermal anneal for 5 seconds at 950° C. or above) from dopant monolayers 38 having covering material 40 thereon (when present) into semiconductor material 12 that is above both sides 17 and 19 of individual recessed-access-gate-line constructions 14a, 14b through each of two opposing sidewall surfaces 21 and 23 of each of two pairs 21/23. FIGS. 10-12 diagrammatically show the diffused dopants as initially forming respective annuli 42.

Figure 13:
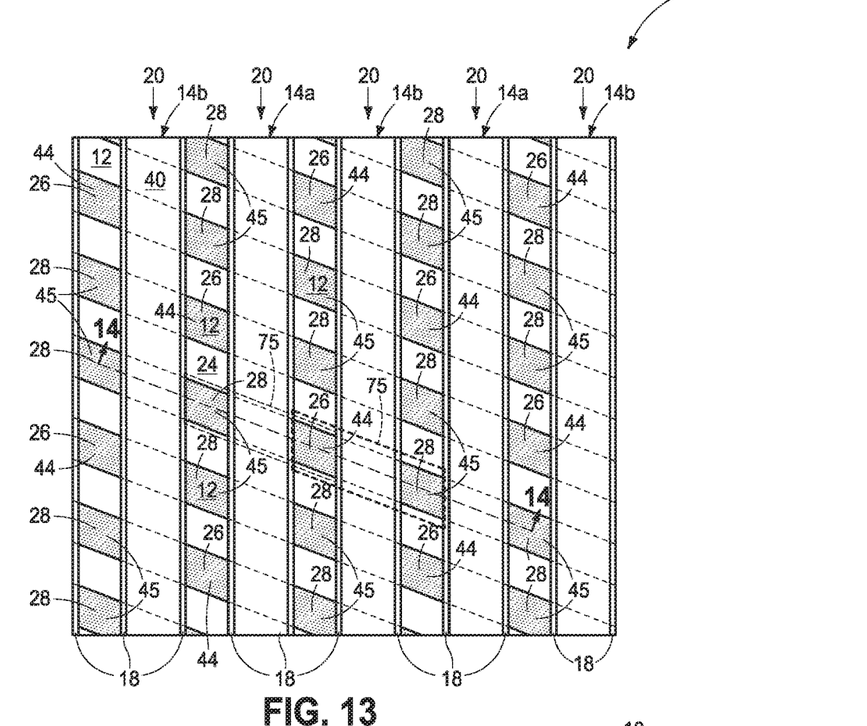
FIG. 13 is a view of the FIG. 10 construction at a processing step subsequent to that shown by FIG. 10, and is taken through line 13-13 in FIG. 14.
Figure 14:
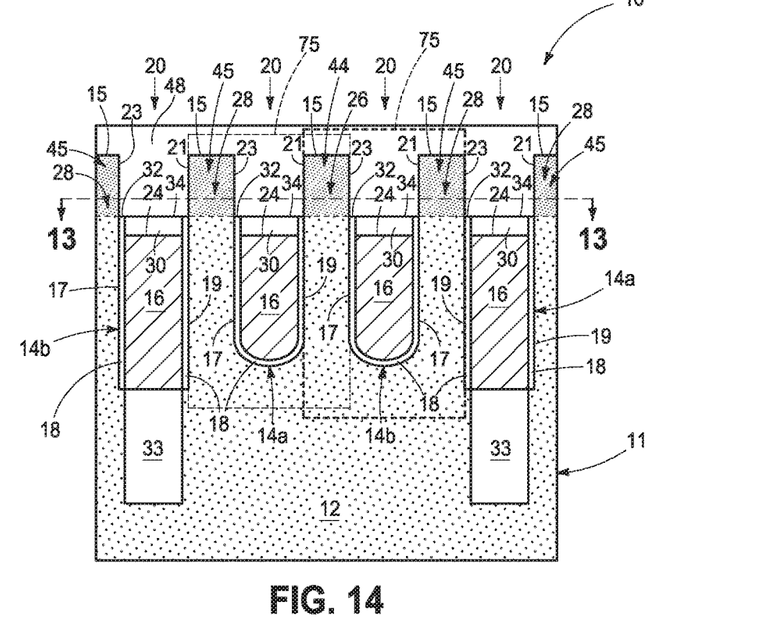
FIG. 14 is a cross-sectional view taken through line 14-14 in FIG. 13.

Subsequent heating/annealing that is one or both of inherent in subsequent processing or as a dedicated step (e.g., at 300° C. or greater for at least 30 minutes) results in likely complete lateral diffusion of the dopants (e.g., annuli 42 disappear), and forming there-from doped source/drain regions 44 and 45 as shown in FIGS. 13 and 14 above both sides 17 and 19 of individual recessed-access-gate-line constructions 14a, 14b. Individual source/drain regions 44 are laterally-inward between recessed-access-gate-line constructions 14a and 14b of individual pairs 14a/14b of the recessed-access-gate-line constructions and comprise individual digit-line-contact regions 26. Source/drain regions 45 are laterally-outward of each of recessed-access-gate-line constructions 14a and 14b of individual pairs 14a/14b to comprise individual capacitor-contact regions 28. Individual transistors 75 are thereby formed (only two being shown with outlines in FIGS. 13 and 14 for clarity). Semiconductor material 12 below source/drain regions 44, 45 and around the bottom of constructions 14a, 14b functions as switchable channel material depending on voltage of conductive gate material 16.

Figure 15:
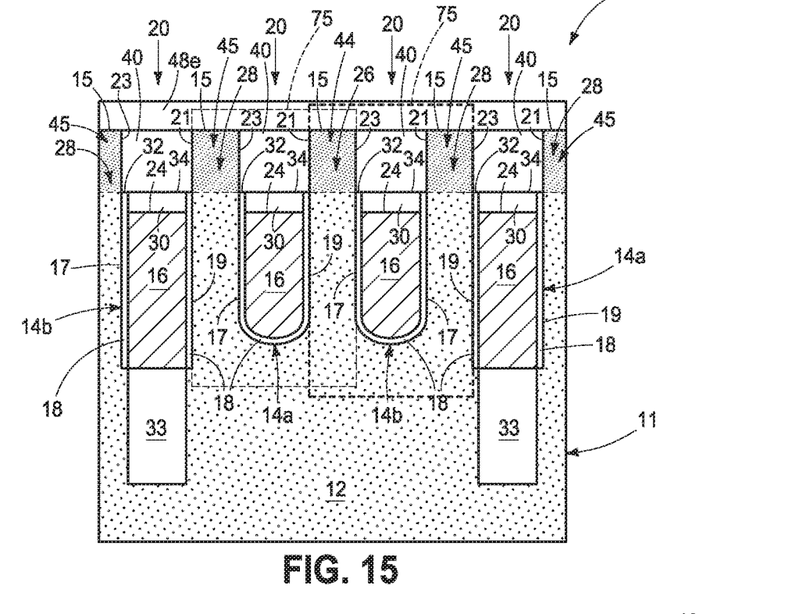
FIG. 15 is a view of the FIG. 11 construction at an alternate processing step to that shown by FIG. 14.
Figure 16:
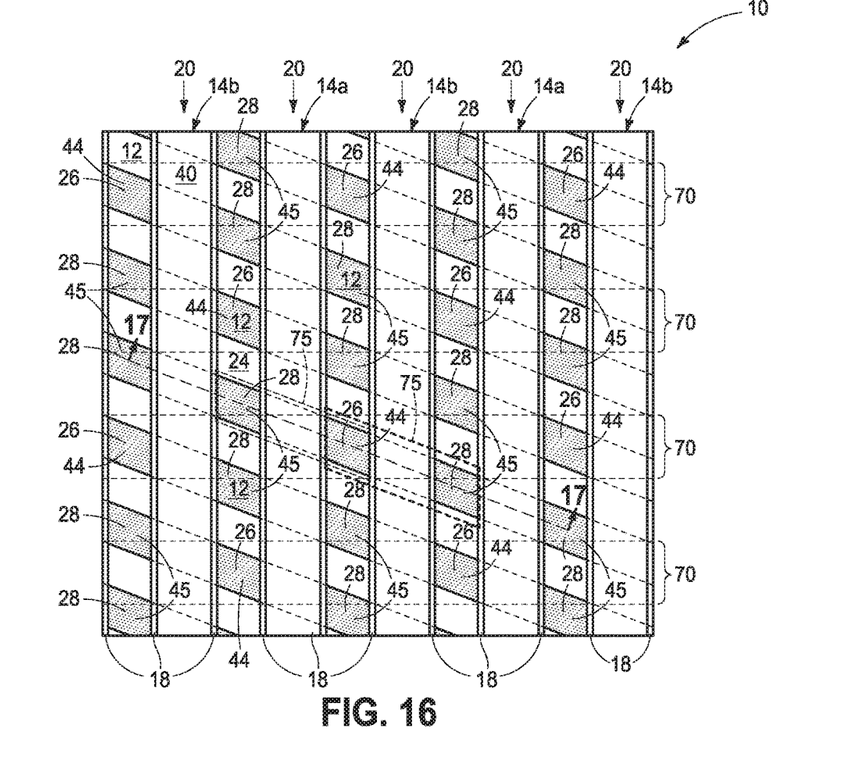
FIG. 16 is a view of the FIG. 13 construction at a processing step subsequent to that shown by FIG. 13, and is taken through line 16-16 in FIG. 17.
Figure 17:
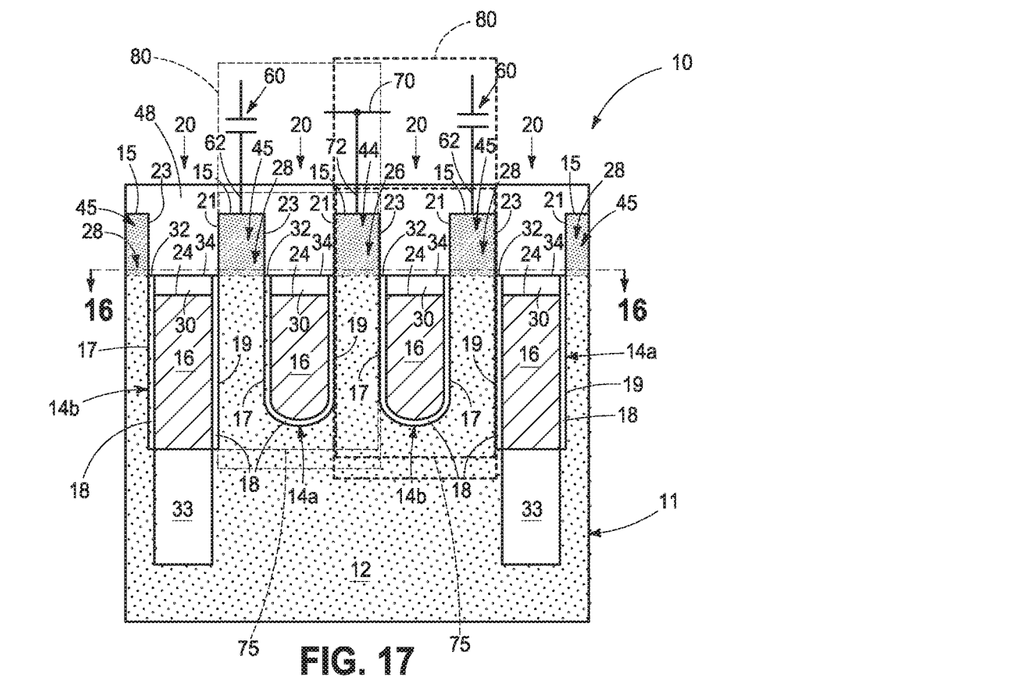
FIG. 17 is a hybrid schematic and cross-sectional view taken through line 17-17 in FIG. 16.

In one embodiment and as shown in FIGS. 13 and 14, all of covering material 40 (not shown) has been removed after the diffusing shown by FIGS. 10-12. Dielectric material 48 has subsequently been deposited atop gate constructions 14 and source/drain regions 44 and 45. Alternately, at least some of a dielectric covering material 40 may not be removed after the act of diffusing the dopants and which remains as part of a finished circuit construction that comprises the transistor. In one such embodiment, none of the dielectric covering material is removed after the diffusing. FIG. 15 shows such an example embodiment and construction 10e wherein all of dielectric covering material 40 as shown in FIG. 6 remains, with dielectric material 48e having been formed thereover. Like numerals from the above described embodiments have been used where appropriate, with some construction differences being indicated with the suffix "e". Any other attribute(s) or aspect(s) as shown and/or described herein with respect to other embodiments may be used Referring to FIGS. 16 and 17, after the act of diffusing the dopants, capacitors 60 are formed which individually electrically couple, in one embodiment directly electrically couple, to individual capacitor-contact regions 28. Digit lines 70 have been formed which individual electrically couple, in one embodiment directly electrically couple, to individual digit-line-contact regions 26. Digit lines 70 are schematically shown in FIG. 17 and example outlines thereof are diagrammatically shown in FIG. 16. Capacitors 60 may be formed above, below, or laterally-overlapping with digit lines 70. Regardless, example individual memory cells 80 are formed that individually comprise a transistor 75 and a capacitor 60. Other constructions may result.

In one embodiment, individual first conductive vias are formed which individually directly electrically couple individual capacitors 60 to individual capacitor-contact regions 28. In one embodiment, individual second conductive vias are formed which individually directly electrically couple individual digit lines 70 to individual digit-line-contact regions 26. By way of examples and diagrammatically, first conductive vias 62 are shown as vertical schematic extensions as part of or from capacitors 60 and which directly electrically couple with individual capacitor-contact regions 28. Additionally, example such second conductive vias 72 are shown as vertical schematic extensions of or from digit lines 70. In one embodiment, at least one of (a) first conductive vias 62 and (b) second conductive vias 72 are directly against respective tops 15 of their individual capacitor-contact region 28 or individual digit-line-contact region 28, with both (a) and (b) being so-directly against as shown in FIG. 17.

Figure 18:
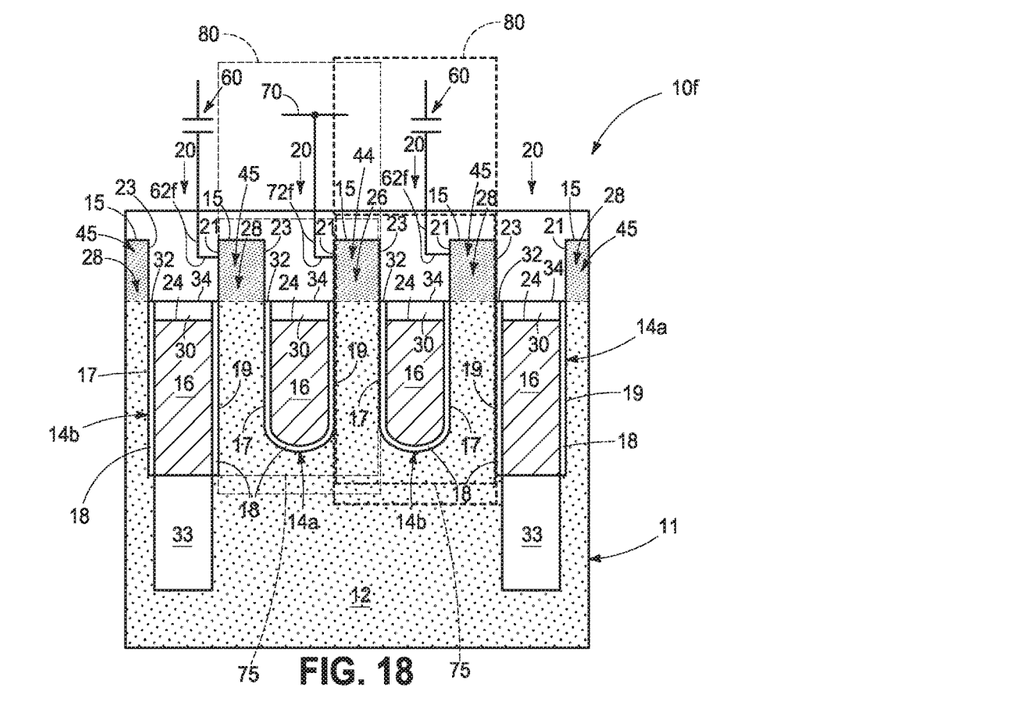
FIG. 18 is a hybrid schematic and cross-sectional view of the FIG. 14 construction at an alternate processing step to that shown by FIG. 17.

An alternate example embodiment is shown in FIG. 18. Like numerals from the above-described embodiments have been used where appropriate, with some construction differences being indicated with the suffix "f". Construction 10f has at least one of (in one embodiment both of, as shown) (a) first conductive vias 62f and (b) second conductive vias 72f directly against a respective sidewall (e.g., a sidewall 21 or 23) of their individual capacitor contact region 26 or individual digit-line-contact region 28.

An embodiment of the invention comprises a method of forming a transistor (e.g., 75) comprising forming a gate construction (e.g., 14a or 14b) having an elevationally-outermost surface (e.g., 24) of conductive gate material (e.g., 16) that is lower than an elevationally-outer surface 15), in one embodiment an elevationally-outermost surface (e.g., 15), of semiconductor material (e.g., 12) that is aside and above both sides (e.g., 17 and 19) of the gate construction. Tops of the semiconductor material (e.g., tops 15) and the conductive gate material (e.g., top 24) are covered with masking material (e.g., 22/30). Two pairs (e.g., two 21/23's) of two opposing sidewall surfaces (e.g., 21 and 23) of the semiconductor material are laterally exposed above both of the sides of the gate construction. After the covering, the semiconductor material that is above both of the sides of the gate construction is subjected to monolayer doping through each of the laterally-exposed two opposing sidewall surfaces of each of the two pairs and doped source/drain regions (e.g., 44 and 45) are formed there-from above both of the sides of the gate construction.

In one embodiment, a method of forming a transistor (e.g., 75) comprises forming a gate construction (e.g., 14a or 14b) having an elevationally outermost surface (e.g., 24) of conductive gate material (e.g., 16) that is lower than an elevationally-outermost surface (e.g., 15) of semiconductor material (e.g., 12) that is aside and above both sides (e.g., 17 and 19) of the gate construction. The semiconductor material that is above both of the sides of the gate construction is subjected to monolayer doping and doped source/drain regions (e.g., 44 and 45) are formed there-from above both of the sides of the gate construction. The monolayer doping is conducted in a vertically-self-aligned manner through two pairs (e.g., 21/23) of opposing sidewall surfaces (e.g., 21 and 23) of the semiconductor material that is above both of the sides of the gate construction.

In one embodiment, a method of forming a transistor (e.g., 75) comprises forming a gate construction (e.g., 14a or 14b) having an elevationally-outermost surface (e.g., 24) of conductive gate material (e.g., 16) that is lower than an elevationally-outer surface (e.g., 15) of semiconductor material (e.g., 12) that is aside and above both sides (e.g., 17 and 19) of the gate construction. Tops of the semiconductor material (e.g., tops 15) and the conductive gate material (e.g., top 24) are covered with masking material. Two pairs (e.g., two 21/23's) of two opposing sidewall surfaces (e.g., 21 and 23) of the semiconductor material are laterally exposed above both of the sides of the gate construction. A dopant monolayer (e.g., 38) is formed directly on each of the laterally-exposed two opposing sidewall surfaces of each of the two pairs. A covering material (e.g., 40 or 40d) is formed directly on the dopant monolayers. Dopants are diffused from the dopant monolayers having the covering material thereon into the semiconductor material that is above both of the sides of the gate construction through each of the two opposing sidewall surfaces of each of the two pairs and doped source/drain regions (e.g., 44 and 45) are formed there-from above both of the sides of the gate construction.

Embodiments of the invention may achieve one or more advantages. For example, embodiments of the invention may be conducted without any ion implantation of dopant in forming source/drain regions, thereby reducing, minimizing, or eliminating defects and/or crystal lattice damage. Additionally, embodiments of the invention may form source/drain regions that are vertically-self-aligned accurately above the transistor gate thereby reducing, minimizing, or eliminating gate induced drain leakage. Additionally, as diameter of an elevationally-projecting cylindrical mass of semiconductor material decreases, the ratio of its area to volume increases, which may lead to more uniform doping of source/drain regions using embodiments of the invention.

In this document, "monolayer doping" is defined as the formation of a self-assembled covalently-bonded dopant-containing monolayer directly on the surface of crystalline semiconductor material followed by annealing to thermally diffuse dopant atoms from the dopant-containing monolayer into the crystalline semiconductor material.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/material s/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, "selective" as to etch, etching, removing, removal, forming, and/or formation is such an act of one stated material relative to another stated material(s) so acted upon at a rate of at least 2:1 by volume.

In this document, a "vertically-self-aligned manner" means a technique whereby length and position of some or all of an elevationally-extending feature (e.g., a source/drain region) is formed by previously-defined top and bottom termini of an elevationally-extending sidewall or a portion thereof of said feature, thereby not requiring subsequent processing with respect to those top and bottom termini, and with the technique being selective to formation of the feature on and/or through said sidewall or portion thereof (i.e., selective to formation on and/or through said sidewall or portion thereof relative to horizontal surfaces and selective to formation on and/or through said sidewall or portion thereof relative to other elevationally-extending surfaces).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a transistor, comprising:
   forming a gate construction having an elevationally-outermost surface of conductive gate material that is lower than an elevationally-outer surface of semiconductor material that is aside and above both sides of the gate construction;
   covering tops of the semiconductor material and the conductive gate material with masking material, two pairs of two opposing sidewall surfaces of the semiconductor material being laterally exposed above both of the sides of the gate construction; and
   after the covering, monolayer doping the semiconductor material that is above both of the sides of the gate construction through each of the laterally-exposed two opposing sidewall surfaces of each of the two pairs and forming there-from doped source/drain regions above both of the sides of the gate construction.

2. The method of claim 1 wherein the covering of the tops of the semiconductor material with the masking material and the covering of the top of the conductive gate material with the masking material occur over different time-spaced periods of time.

3. The method of claim 2 wherein the covering of the tops of the semiconductor material with the masking material occurs before the covering of the top of the conductive gate material with the masking material.

4. The method of claim 1 wherein the covering forms the masking material atop the semiconductor material and the masking material atop the conductive gate material to comprise different compositions relative one another.

5. The method of claim 1 wherein the elevationally-outer surface of the semiconductor material that is above both of the sides of the gate construction is the elevationally-outermost surface of the semiconductor material that is above both of the sides of the gate construction.

6. The method of claim 1 wherein the covering of the tops of the conductive gate material comprises:
   depositing the masking material laterally over two facing sidewall surfaces of the semiconductor material that is above both of the sides of the gate construction, the two facing sidewall surfaces individually being a different one of the two opposing sidewall surfaces from a different one of the two pairs; and
   elevationally recessing the masking material that is laterally over said two facing sidewall surfaces and to leave the top of the conductive gate material covered by the masking material.

7. The method of claim 6 wherein the gate construction comprises gate insulator material aside the conductive gate material, the gate insulator material also extending elevationally along said two facing sidewall surfaces, the covering comprising:
   forming the masking material laterally aside the gate insulator material that extends elevationally along said two facing sidewall surfaces; and
   elevationally recessing the gate insulator material that extends elevationally along said two facing sidewall surfaces.

8. The method of claim 7 wherein,
   the gate insulator material and the masking material that is laterally aside the gate insulator material that extends elevationally along said two facing sidewall surfaces are of the same composition relative one another; and
   the elevationally recessing of the masking material that is laterally over said two facing sidewall surfaces and the elevationally recessing of the gate insulator material that extends elevationally along said two facing sidewall surfaces comprising chemical etching said gate insulator material and said masking material at the same time.

9. The method of claim 8 wherein,
   the covering forms the masking material atop the semiconductor material and the masking material atop the conductive gate material to comprise different compositions relative one another; and
   the chemical etching being conducted selectively relative to the masking material that is atop the semiconductor material.

10. The method of claim 7 wherein after the elevationally recessings, the masking material that is laterally aside the gate insulator material that extends elevationally along said two facing sidewall surfaces and the gate insulator material that extends elevationally along said two facing sidewall surfaces have respective elevationally-outermost surfaces that are at a common elevation above the conductive gate material.

11. The method of claim 1 wherein,
the monolayer doping comprises:
forming of a self-assembled covalently-bonded dopant-containing monolayer directly on each of the laterally-exposed two opposing sidewall surfaces of each of the two pairs;
forming a dielectric covering material directly on the dopant-containing monolayers; and
diffusing dopants from the dopant-containing monolayers having the dielectric covering material thereon into the semiconductor material that is above both of the sides of the gate construction through each of the two opposing sidewall surfaces of each of the two pairs and forming there-from the doped source/drain regions; and
not removing at least some of the dielectric covering material after the diffusing and which remains as part of a finished circuit construction that comprises the transistor.

12. The method of claim 11 comprising not removing any of the dielectric covering material after the diffusing.

13. The method of claim 1 wherein,
the monolayer doping comprises:
forming of a self-assembled covalently-bonded dopant-containing monolayer directly on each of the laterally-exposed two opposing sidewall surfaces of each of the two pairs;
forming a covering material directly on the dopant-containing monolayers; and
diffusing dopants from the dopant-containing monolayers having the covering material thereon into the semiconductor material that is above both of the sides of the gate construction through each of the two opposing sidewall surfaces of each of the two pairs and forming there-from the doped source/drain regions; and
removing all of the covering material after the diffusing.

14. A method of forming a transistor, comprising:
forming a gate construction having an elevationally-outermost surface of conductive gate material that is lower than an elevationally-outermost surface of semiconductor material that is aside and above both sides of the gate construction; and
monolayer doping the semiconductor material that is above both of the sides of the gate construction and forming there-from doped source/drain regions above both of the sides of the gate construction, the monolayer doping being conducted in a vertically-self-aligned manner through two pairs of opposing sidewall surfaces of the semiconductor material that is above both of the sides of the gate construction.

15. A method of forming a transistor, comprising:
forming a gate construction having an elevationally-outermost surface of conductive gate material that is lower than an elevationally-outer surface of semiconductor material that is aside and above both sides of the gate construction;
covering tops of the semiconductor material and the conductive gate material with masking material, two pairs of two opposing sidewall surfaces of the semiconductor material being laterally exposed above both of the sides of the gate construction;
forming a dopant monolayer directly on each of the laterally-exposed two opposing sidewall surfaces of each of the two pairs;
forming a covering material directly on the dopant monolayers; and
diffusing dopants from the dopant monolayers having the covering material thereon into the semiconductor material that is above both of the sides of the gate construction through each of the two opposing sidewall surfaces of each of the two pairs and forming there-from doped source/drain regions above both of the sides of the gate construction.

16. The method of claim 15 comprising forming the dopant monolayers by atomic layer deposition.

17. The method of claim 15 comprising monolayer doping wherein forming the dopant monolayers is by formation of a self-assembled covalently-bonded dopant-containing monolayer directly on each of the laterally-exposed two opposing sidewall surfaces of each of the two pairs.

18. A method of forming an array of memory cells, comprising:
forming recessed-access-gate-line constructions within semiconductor material, the recessed-access-gate-line constructions individually having an elevationally-outermost surface of conductive gate material that is lower than an elevationally-outermost surface of the semiconductor material that is aside and above both sides of the individual recessed-access-gate-line construction, laterally-spaced pairs of the recessed-access-gate-line constructions individually comprising a digit-line-contact region laterally-inward between the recessed-access-gate-line constructions of the pair of the recessed-access-gate-line constructions and a capacitor-contact region laterally-outward of each of the recessed-access-gate-line constructions of the pair of the recessed-access-gate-line constructions;
covering tops of the semiconductor material and the conductive gate material with masking material, two pairs of two opposing sidewall surfaces of the semiconductor material being laterally exposed above both of the sides of the individual recessed-access-gate-line constructions;
after the covering, monolayer doping the semiconductor material that is above both of the sides of the individual recessed-access-gate-line constructions through each of the laterally-exposed two opposing sidewall surfaces of each of the two pairs and forming there-from doped source/drain regions above both of the sides of the individual recessed-access-gate-line constructions, the source/drain region laterally-inward between the recessed-access-gate-line constructions of individual of the pairs of the recessed-access-gate-line constructions comprising individual of the digit-line-contact regions, the source/drain regions laterally-outward of each of the recessed-access-gate-line constructions of the individual pairs of the recessed-access-gate-line constructions comprising individual of the capacitor-contact regions; and
after the monolayer doping, forming capacitors individually electrically coupled to the individual capacitor-contact regions and forming digit lines individually electrically coupled to the individual digit-line-contact regions.

19. The method of claim 18 wherein,
individual first conductive vias are formed which individually directly electrically couple individual of the capacitors to the individual capacitor-contact regions;
individual second conductive vias are formed which individually directly electrically couple individual of the digit lines to the individual digit-line-contact regions; and at least one of (a) the first conductive vias, and (b) the second conductive vias being directly against respective tops of their individual capacitor-contact region or individual digit-line-contact region.

20. The method of claim 18 wherein, individual first conductive vias are formed which individually directly electrically couple individual of the capacitors to the individual capacitor-contact regions;

individual second conductive vias are formed which individually directly electrically couple individual of the digit lines to the individual digit-line-contact regions; and at least one of (a) the first conductive vias, and (b) the second conductive vias being directly against a respective sidewall of their individual capacitor-contact region or individual digit-line-contact region.

21. A method of forming an array of memory cells, comprising:

forming recessed-access-gate-line constructions within semiconductor material, the recessed-access-gate-line constructions individually having an elevationally-outermost surface of conductive gate material that is lower than an elevationally-outermost surface of the semiconductor material that is aside and above both sides of the individual recessed-access-gate-line construction, laterally-spaced pairs of the recessed-access-gate-line constructions individually comprising a digit-line-contact region laterally-inward between the recessed-access-gate-line constructions of the pair of the recessed-access-gate-line constructions and a capacitor-contact region laterally-outward of each of the recessed-access-gate-line constructions of the pair of the recessed-access-gate-line constructions;

covering tops of the semiconductor material and the conductive gate material with masking material, two pairs of two opposing sidewall surfaces of the semiconductor material being laterally exposed above both of the sides of the individual recessed-access-gate-line constructions;

forming a dopant monolayer directly on each of the laterally-exposed two opposing sidewall surfaces of each of the two pairs above both of the sides of the individual recessed-access-gate-line constructions;

forming a covering material directly on the dopant monolayers;

diffusing dopants from the dopant monolayers having the covering material thereon into the semiconductor material that is above both of the sides of the individual recessed-access-gate-line constructions through each of the two opposing sidewall surfaces of each of the two pairs for the individual recessed-access-gate-line constructions and forming there-from doped source/drain regions above both of the sides of the individual recessed-access-gate-line constructions, the source/drain region laterally-inward between the recessed-access-gate-line constructions of individual of the pairs of the recessed-access-gate-line constructions comprising individual of the digit-line-contact regions, the source/drain regions laterally-outward of each of the recessed-access-gate-line constructions of the individual pairs of the recessed-access-gate-line constructions comprising individual of the capacitor-contact regions; and after the diffusing, forming capacitors individually electrically coupled to the individual capacitor-contact regions and forming digit lines individually electrically coupled to the individual digit-line-contact regions.

* * * * *